United States Patent [19]
Anthony et al.

[11] Patent Number: 5,264,071
[45] Date of Patent: Nov. 23, 1993

[54] FREE STANDING DIAMOND SHEET AND METHOD AND APPARATUS FOR MAKING SAME

[75] Inventors: Thomas R. Anthony, Schenectady; James F. Fleischer, Scotia, both of N.Y.

[73] Assignee: General Electric Company, Schenectady, N.Y.

[21] Appl. No.: 537,963

[22] Filed: Jun. 13, 1990

[51] Int. Cl.$^5$ .............................................. C30B 25/06
[52] U.S. Cl. ..................... 156/612; 156/DIG. 68; 423/446; 427/59 D; 501/86
[58] Field of Search ............... 156/612, DIG. 68; 423/446; 427/39; 501/86

[56] References Cited

U.S. PATENT DOCUMENTS

| | | |
|---|---|---|
| 3,895,313 | 7/1975 | Seitz . |
| 4,332,751 | 6/1982 | Brassell et al. . |
| 4,604,292 | 8/1986 | Evans et al. ............... 427/39 |
| 4,816,286 | 3/1989 | Hirose .................... 423/446 |
| 4,859,493 | 8/1989 | Lemelson ................. 423/446 |
| 4,919,974 | 4/1990 | McCune et al. ........... 427/39 |

FOREIGN PATENT DOCUMENTS

| | | |
|---|---|---|
| 0320657 | 6/1989 | European Pat. Off. . |
| 0400947 | 12/1990 | European Pat. Off. . |
| 0141697 | 7/1985 | Japan .................... 501/86 |
| 4000266 | 1/1989 | Japan .................... 423/446 |

OTHER PUBLICATIONS

*Diamond-Ceramic Coating of the Future*; Karl E. Spear; Journal Am Ceram Soc 72[2]171-91 (1989).
Chemical & Engineering News, May 15, 1989, pp. 24-39.
Xiang Xi Bi et al., Proceedings of SPIE, vol. 1146, 1989, London, GB, pp. 192-200.

Primary Examiner—Robert Kunemund
Assistant Examiner—Felisa Garrett
Attorney, Agent, or Firm—William H. Pittman

[57] ABSTRACT

The bond strength between a diamond and the substrate onto which it is deposited by the chemical vaporization method is decreased to the point where the diamond can be removed from the substrate as a free standing monolithic sheet. The bond strength can be decreased by polishing the substrate, removing corners from the substrate, slow cooling of the substrate after deposition, an intermediate temperature delay in cooling or the application or formation of an intermediate layer between the diamond and the substrate. The free standing sheet of diamond can be used as a laser lens, metallized to form a mirror, or silver soldered to tungsten carbide to form a cutting tool.

12 Claims, 2 Drawing Sheets

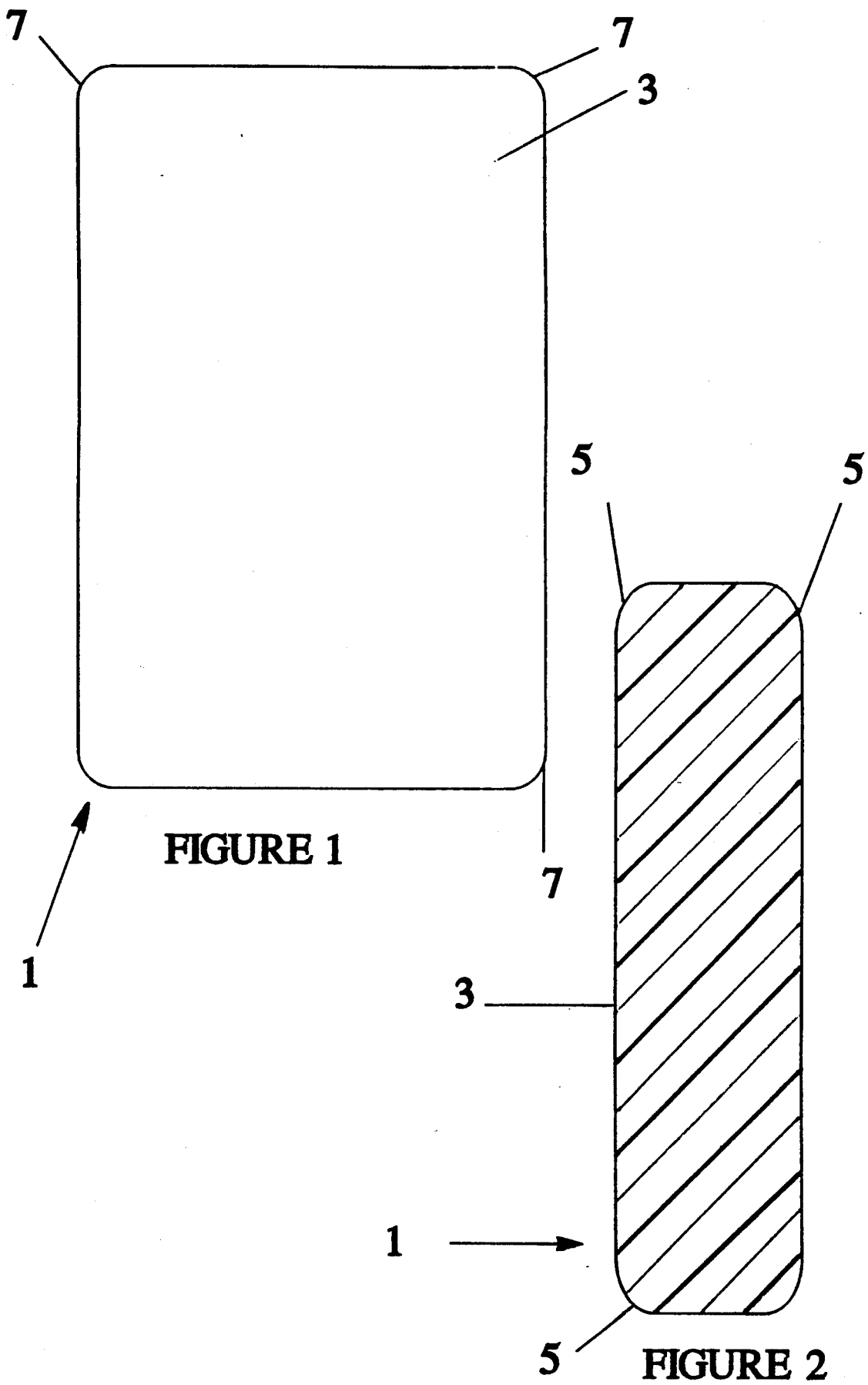

FREE STANDING DIAMOND SHEET AND METHOD AND APPARATUS FOR MAKING SAME

This invention relates to diamonds made by the chemical vapor deposition of monolithic diamond onto a substrate, and more particularly to method and apparatus for the separation of diamond from the substrate.

Various methods are known for the synthetic production and shaping of diamond. For example, U.S. Pat. No. 3,895,313 discloses first forming a synthetic diamond sphere and machining away a large fraction of the sphere to form a diamond window. Diamond windows are used for lasers. Due to prior art size limitations, a large number of small windows are required for large lasers. In particular, the deposition of diamond coatings on substrates to produce cutting and abrasive tools is known.

One class of methods developed in recent years for synthetic diamond deposition consists of the chemical vapor deposition (hereinafter sometimes "CVD") methods. For a general summary of various diamond deposition methods including CVD methods, reference is made to *Chemical & Engineering news*, 67(20), 24–39 (May 15, 1989), incorporated herein by reference. Reference in the article to a free standing sheet of diamond is probably the result of one of the present inventors showing one of the authors a diamond sheet about one inch square made during the experimental development of the present invention. No disclosure was made as to the technique used to make the sheet of diamond.

In the CVD methods, a mixture of hydrogen and a hydrocarbon gas such as methane is thermally activated and passed into contact with a substrate. The hydrogen gas is converted to atomic hydrogen which reacts with the hydrocarbon to form elemental carbon, which deposits on the substrate in the form of diamond. Many of the CVD diamond coating methods, hereinafter referred to as "filament" methods, employ one or more resistance heating units including heated wires or filaments, typically at temperatures of at least 2000° C., to provide the high activation temperatures at which these conversions take place.

Relatively thick diamond coatings are required in the manufacture of such articles as cutting tools. However, a problem which often arises is the failure of thick diamond coatings to adhere to the substrate, as a result or differences in coefficient of thermal expansion between the diamond and the substrate.

Thus, for example, cutting tools comprising a diamond layer on substrates other than the molybdenum used in the original deposition are often desired. The coefficients of thermal expansion of diamond and molybdenum are so different that stresses are produced in the diamond coated molybdenum as it cools from the temperature at which diamond deposition takes place. Thin diamond coatings are usually elastic enough to withstand such stresses, but thick coatings of the type desired on cutting tools may cause separation of diamond from the molybdenum substrate and/or catastrophic failure of the diamond layer in the form of severe cracking and fragmentation.

The present invention provides a method for reducing adhesion between CVD produced diamond and substrates such as those of molybdenum, to facilitate removal of the diamond from the molybdenum substrate. The present invention also provides diamonds unencumbered with substrates, which diamonds can be used as such or securely bonded to substrates other than those onto which the diamonds were originally deposited without stresses of the magnitude of those encountered in the deposition method of bonding. The uncoated diamonds can be silver soldered to the more useful substrates such as tungsten carbide and used as cutting tools for lathes.

The present invention is based in part on the discovery that much of the strength of bonding between CVD diamond and the substrate stems from mechanical interlocking of the interfaces. Upon failure of an interface, CVD diamond does not separate cleanly on cooling but breaks into many pieces, some of which remain on the substrate. The substrate in turn does not separate cleanly from the diamond but breaks into many pieces which remain in the CVD diamond.

In one of its aspects, therefore, the invention is a method for reducing adhesion of a diamond coating produced by chemical vapor deposition on a substrate. One means of accomplishing reduced adhesion is to provide a smooth substrate surface for deposition. The smooth substrate surface reduces the mechanical interlocking of the CVD diamond and the substrate. The bonding of CVD diamond coating to the substrate can also be effectively reduced by rounding the corners of the substrate coated with CVD diamond. The surface of the substrate can be smoothed by milling, planing or polishing, or by chemical treatments such as plating, etching or other treatments known in the art.

The improvement of the apparatus of the present invention for making a diamond by the chemical vapor deposition of an intact sheet of diamond onto a substrate is directed primarily to a smooth diamond receiving surface on the substrate to facilitate separation of the intact sheet of diamond from the substrate. To further facilitate removal of the diamond from the substrate, the substrate has rounded corners on the diamond receiving surface of the substrate. The substrate also preferably has rounded edges on the diamond receiving surface of the substrate. In other words it is essential that the entire surface of the diamond receiving surface be smooth and free of surface irregularities which would physically bond to CVD diamond and prevent the diamond from being removed from the surface without breakage of the diamond. Surface irregularities include indentations, protrusions or sharp edges which would prevent the removal of an intact sheet of monolithic diamond from the surface of the substrate onto which the diamond was deposited. Preferably surface indentations of the diamond receiving surface of the substrate do not exceed 0.3 microns in depth, and surface protrusions on the substrate do not exceed 0.3 microns in height. In addition it is preferred that the diamond receiving surface of the substrate is free of sharp edges.

The substrate may be selected from the class comprising silicon carbide, tungsten carbide and molybdenum, which are representative, and preferably is molybdenum. The substrate can be coated with a material which facilitates release of the diamond from the substrate. Representative coatings include a boron nitride slurry, or a powder selected from the class comprising boron nitride, cerium oxide, graphite, iron oxide, ferric ferrocyanide (Prussian Blue), boron and preferably, molybdenum carbide. The substrate can also be prereacted with carbon or boron to form a surface coating which facilitates release of a CVD diamond from the surface.

The bond between a monolithic sheet of diamond formed by the chemical vaporization deposition of diamond and the substrate onto which the diamond was formed is of sufficient strength to retain the diamond sheet on the substrate during formation. The bond can be weakened by a cooling rate which decreases the bond strength of the diamond sheet to the substrate sufficiently to allow removal of the diamond sheet intact from the substrate. It is believed that as the cooling rate is decreased, an interfacial phase transformation takes place in a $Mo_2C$ layer between the CVD diamond and the molybdenum substrate which weakens the bond between the CVD diamond and the substrate thus facilitating separation of the diamond from the substrate. The time for cooling from 50° C. below deposition temperature to a temperature of 400° C. can be extended to from 10 minutes to the time the diamond sheet spontaneously separates from the substrate, usually less than four hours. The preferred time extension is from 15 minutes to two hours. The time can be extended by slowly decreasing the current to the filaments or increasing pressure in the chamber where chemical vapor deposition takes place. The cooling rate is preferably lowered by continuing filament heating while increasing chamber pressure.

Another method of weakening the interfacial bond is by stopping the cooling for a period of time. It is believed that when cooling is stopped that an interfacial precipitation of hydrogen takes place at the CVD diamond-molybdenum substrate interface which weakens the bond between the CVD diamond and the substrate thus facilitating separation of the diamond from the substrate. The preferred period of time for cooling stoppage is from five minutes to one hour. The cooling is preferably stopped in the range of the temperature extending from 50° C. below the substrate temperature at deposition down to 400° C., often 800° C. to 400° C. The initial substrate temperature is preferably lowered 50° C. before cooling is stopped.

This idea can be extended to other suitable gases such as nitrogen that can dissolve in molybdenum. In the case of nitrogen, it would be added to the CVD gases as an inert carrier gas so that it could saturate molybdenum at the diamond deposition temperature and precipitate out at the diamond-molybdenum interface on cooling. However, hydrogen is the preferred gas because of its relatively high mobility in molybdenum and because it is already present in CVD diamond deposition as an active atomic species.

Another method of weakening the interfacial bond is by first applying to said substrate a layer of a material which decreases adhesion of the diamond coating to the substrate, subsequently depositing said diamond coating on said adhesion decreasing layer, and then removing said diamond coating from said substrate. The preferred substrate is molybdenum. The adhesion decreasing layer is selected for example from the class comprising molybdenum carbide, boron nitride slurry, boron nitride powder, cerium oxide powder, graphite powder, iron oxide powder, ferric ferrocyanide (Prussian Blue), boron, and boron or carbon reacted with the surface of the substrate. In addition to being coated with a layer of material which decreases adhesion of diamond to the substrate, the surface of the substrate is also preferably polished or smooth to further decrease the adhesion of the diamond coating to the substrate. The thickness of the adhesion decreasing layer is preferably less than one mil in thickness, though coatings greater than one mil (thick coatings) are also useful.

The present invention is also directed to diamonds made by the processes of the present invention. Such diamonds are free standing, larger, smoother, contain more surface area, and mirror the deposition surface of the substrate, as opposed to the prior art diamonds which are either attached to the surface of the substrate or break into irregular shapes or shatter when the prior art diamonds unintentionally separate from the substrate.

The present invention is applicable to any apparatus used for the chemical vaporization deposition of diamond on a substrate. The present invention, insofar as CVD apparatus is concerned is directed to the substrate, treatment of the substrate, and methods of using the apparatus. The detailed description of the invention referring to one type of apparatus which follows is representative of the practice of the present invention using other types of conventional CVD apparatus.

BRIEF DESCRIPTION OF THE DRAWINGS

The invention will be described in detail with reference to the drawings, in which:

FIG. 1 is a face view of an illustrative substrate used in the practice of the present invention;

FIG. 2 is a lengthwise sectional view of the substrate;

DETAILED DESCRIPTION OF THE INVENTION

Figure 3:
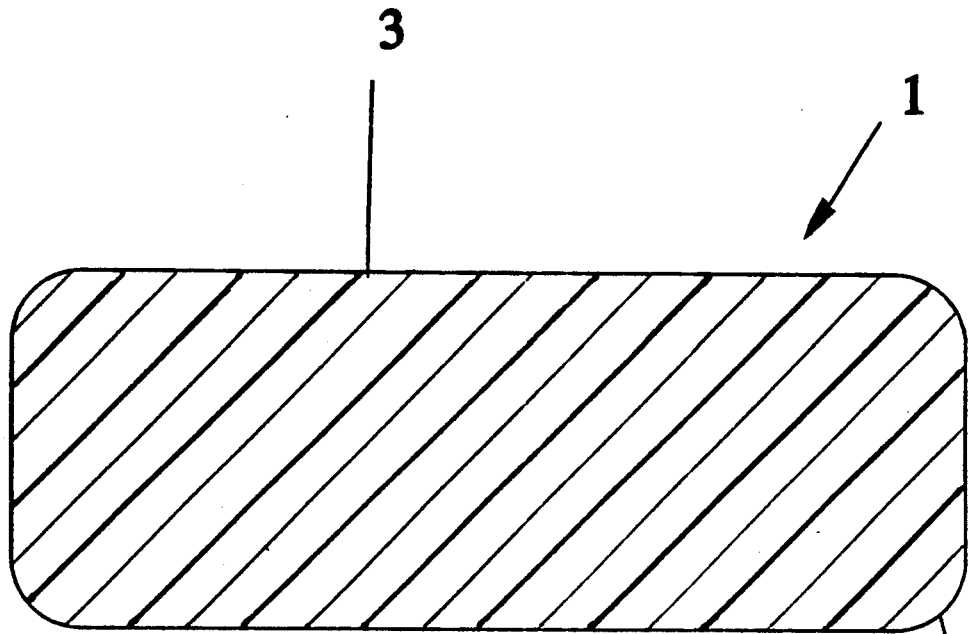
FIG. 3 is a sectional view through the width of the substrate.

The interior features of one type of a CVD diamond deposition unit that can be used in the practice of the present invention to make very large, approximately one square foot sheets of free standing CVD diamond are referred to below. The apparatus is merely contemplated for use, and is described merely to impart an understanding of the present invention. Substrates used had a deposition face on the order of one to one and one half inch by 10 to 12 inches.

All of said features, of the apparatus and are enclosed in a reaction chamber (not shown) which is air-tight and thus capable of being maintained at reduced pressure and is fitted with a suitable gas inlet and an exhaust port. All portions of the apparatus which are present in the reaction chamber are constructed of suitable heat-resistant materials, as necessary to withstand filament temperatures on the order of about 2000° C. and substrate temperatures up to about 1000° C. Quartz is an illustrative non conductive heat-resistant material suitable for this purpose.

The features of the apparatus and associated articles include a substrate 1 which has a planar diamond deposition surface 3. The substrate is made of molybdenum. The substrate 1 is maintained in position at a suitable spacing from resistance heating means for deposition to take place.

The resistance heating means comprise two electrodes and a one or more vertically extending linear, electrically conductive filaments or wires (hereinafter generically designated "filaments"), and otherwise being of conventional design and circuitry. The material of which said filaments are comprised is not critical, any material known in the art as suitable for this purpose being acceptable. Illustrative materials are metallic tungsten, tantalum, molybdenum and rhenium; because of its relatively low cost and particular suitability, tungsten is often preferred. Filament diameters of about 0.2-1.0 mm. are typical, with about 0.8 mm. frequently being preferred.

The filaments are located parallel to the substrate 1. Distances from filaments to substrate are generally on the order of 5-10 mm. Since one or a plurality of filaments and associated structure are present, reference thereto hereinafter and in the drawings will be to only one; it should be understood that the total number thereof is not critical to the invention.

It is highly desirable to maintain substrates 1 at temperatures in the range of about 900°-1000° C., since within this range minimum reaction occurs between the hydrogen present in the gas mixture and the elemental carbon formed from the hydrocarbon therein; thus, said elemental carbon remains available to deposit as diamond at a high growth rate on the substrate. Absent any provisions for independently controlling substrate temperature, said temperature frequently exceeds 1000° C. and the diamond growth rate decreases substantially.

The desired temperature control is achieved by substrate cooling means comprising a heat sink. The substrate 1 is positioned between the heat sink and the filament. The heat sink is typically made of metallic copper and cooled by attached serpentine tubing (also usually of copper) fitted with a cooling water inlet and outlet respectively. In operation, the reaction chamber of the apparatus of this invention is maintained at a pressure up to about 760 torr, typically on the order of 10 torr. A mixture of hydrogen and a hydrocarbon, most often methane and generally present in an amount up to about 2% by volume based on total gas, is passed into the chamber and a current is passed through the electrodes and filaments to heat the filaments to a temperature of at least about 2000° C. With the substrate configuration employed, gas diffusion between the substrates and in contact with the filaments promotes excellent nucleation and growth of diamond particle.

The heat sink(s) is maintained at a distance from the substrate and water passage through the tubing associated therewith is maintained at a rate to provide a substrate temperature in the range of about 900°-1000° C., most often about 950° C. At such temperatures, diamond growth rate approaches its highest value.

Referring now more particularly to FIG. 1 there is shown a cross sectional view of substrate 1. A substrate of molybdenum was selected for several reason. First, molybdenum generates a high density of diamond nuclei without having been roughened or subjected to abrasion with diamond dust. Secondly, the thermal expansion coefficient of molybdenum ($\alpha = 5.1 \times 10^{-6}/°$ C.; the expansion coefficient of molybdenum is relatively constant with temperature above 152° C., its Debye temperature) is larger than the thermal expansion coefficient of diamond ($\alpha = 1.5 \times 10^{-6}/°$ C. at 124° C. and $4.8 \times 10^{-6}/°$ C. at 930° C.; the thermal expansion coefficient of diamond is rapidly changing in the temperature range of CVD diamond growth since its Debye temperature of 1700° C. is far above this temperature range).

Figure 4:
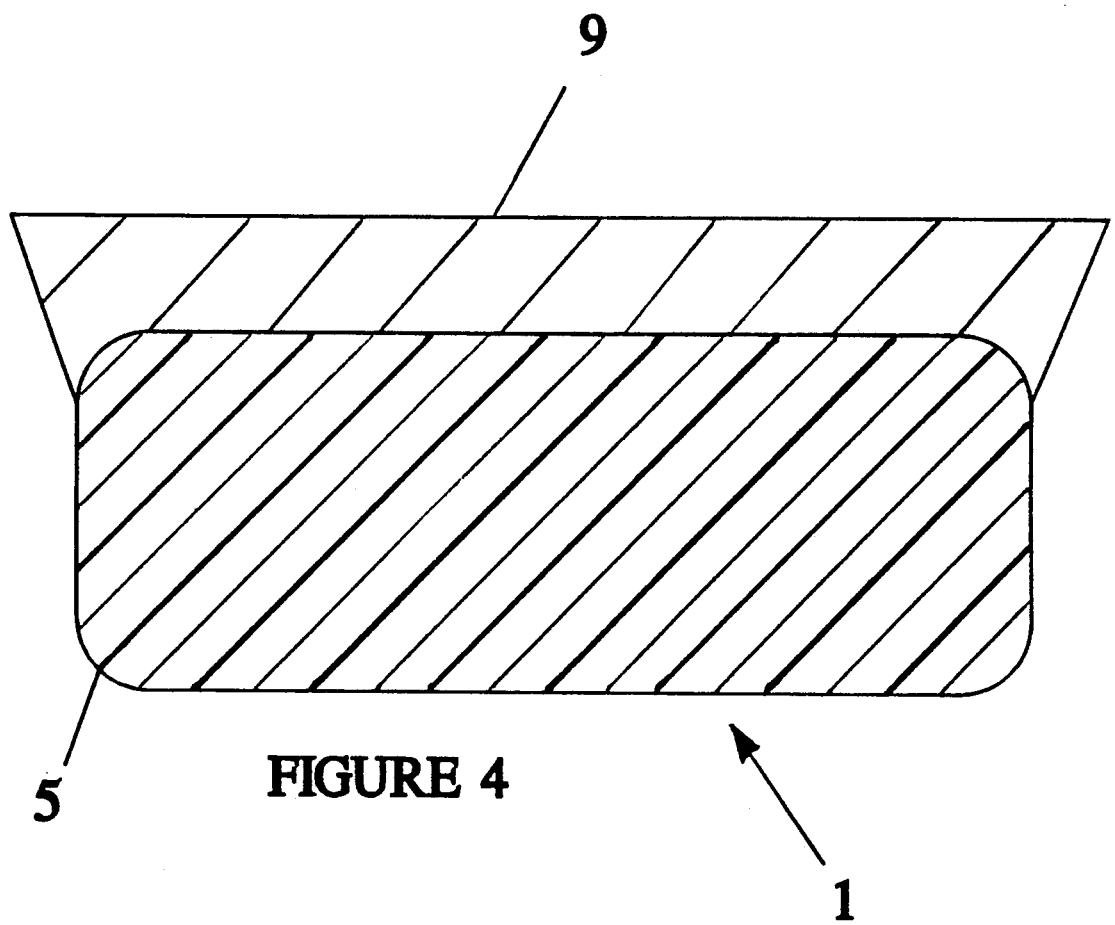
FIG. 4 is a sectional view of the substrate of FIG. 3 coated with diamond.

Because the thermal expansion coefficient of molybdenum is 30% larger than the average thermal expansion coefficient of diamond between the substrate deposition temperature and room temperature, the diamond is placed under compression as the substrate is cooled after deposition is finished. This compressive stress in diamond and the tensile stress is molybdenum is at first accommodated by elastic strain in the diamond and the molybdenum. However, this elastic strain energy is released when a crack propagates down the diamond-molybdenum interface and severs the connection between the molybdenum and the diamond. If the stored elastic energy is much greater than the interface surface energy, the separation will start simultaneously at many places on the molybdenum-diamond interface and a large number of small pieces of diamond will be obtained in the catastrophic separation. To prevent the catastrophic separation, the diamond receiving surface 3 of molybdenum substrate 1 is polished to a mirror finish (0.3 micron polishing compound) and its edges 5 and its corners 7 are rounded off as is shown also in FIGS. 2 and 3. Substrate 1 coated with diamond 9 is shown in cross section in FIG. 4. The diamond can either be removed manually or by the procedures set forth below.

An additional means of preventing catastrophic separation, to be used preferably in combination with uniform surface smoothness, is by control of the cooling rate of the molybdenum-diamond interface to weaken the interface bond. Without being bound by theory, it is believed that one of the reasons for easy release of the diamond sheet from the molybdenum substrate is the thermal instability of $Mo_2C$ or $MoC$ (the two formulas represent different molybdenum carbide compositions). $Mo_2C$ is stable above 600° C. but is unstable below 600° C. Upon examination of molybdenum substrates with x-ray diffraction both $MoC$ and $Mo_2C$ have been detected. Most likely, these occur in layers with the carbon-rich molybdenum carbide on tip of the carbon-poor molybdenum carbide.

When the substrate is exposed to the gases in a CVD diamond reactor above 500° C., $Mo_2C$ forms first followed by an overlayer of $MoC$. Subsequently, a thick diamond layer forms onto the surface of this molybdenum carbide sandwich. Because the mobility of carbon in diamond is extremely low at the deposition temperature, the overgrowth of diamond cuts off the source of carbon to the underlying layers and most of the $MoC$ is slowly converted to $Mo_2C$. Consequently, at the completion of diamond growth, a thick diamond layer sits on top of a predominantly $Mo_2C$ layer (a very thin interfacial layer of $MoC$ will still exist) which in turn sits on top of a molybdenum substrate that is saturated with carbon.

If this sandwich is cooled rapidly, the $Mo_2C$ layer will survive as the temperature decreases below 500° C. because of kinetic factors which do not allow enough time for the $Mo_2C$ to decompose to molybdenum and carbon. At room temperature because of the lack of atomic mobility in the $Mo_2C$ lattice, the compound will be stable indefinitely.

If the diamond-molybdenum substrate sandwich is cooled slowly, the $Mo_2C$ will decompose. Decomposition of this layer will weaken any interfacial bonding between the substrate and the diamond sheet. Stresses built up by the difference in thermal expansion between the diamond and the molybdenum substrate will rupture the weak decomposed $Mo_2C$ layer and thus free the diamond sheet from the molybdenum substrate.

The exact reaction that happens is not as important as the fact the some reaction occurs which weakens the interfacial adhesion of diamond to the molybdenum substrate. Separation of the diamond from the substrate is enhanced if the diamond bonded to the molybdenum substrate is annealed for a time, with or without cooling, below 900° C., with or without hydrogen, to allow reactions like the following to go to completion.

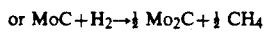

Another means of preventing catastrophic separation is by stopping the cooling of the molybdenum-diamond interface at an intermediate cooling temperature to precipitate hydrogen at the interface. The solubility S of hydrogen in molybdenum is given by:

$$S = 27 \exp(-9700/RT) \text{ cm}^3/100 \text{ gm-molybdenum}$$

where T is the temperature in degrees Kelvin. At the deposition temperature of 900° C., the solubility of hydrogen in molybdenum is 0.42 cm³ per 100 gm of molybdenum. On cooling, the solubility of hydrogen decreases with temperature as shown in Table I

TABLE I

| Temperature (°C.) | Solubility (cm³/100 gm) |
|---|---|
| 900 | 0.42 |
| 800 | 0.29 |
| 700 | 0.18 |
| 600 | 0.10 |
| 500 | 0.05 |
| 400 | 0.02 |
| 300 | 0.005 |

The diffusivity D of Hydrogen in molybdenum is given by:

$$D = 0.059 \exp(-14,700/RT) \text{ cm}^2/\text{sec}$$

The diffusivity also decreases rapidly with temperature as shown in Table II

TABLE II

| Temperature (°C.) | Diffusivity (cm²/sec) × 10⁵ |
|---|---|
| 900 | 10.7 |
| 800 | 6 |
| 700 | 2.9 |
| 600 | 1.2 |
| 500 | 0.4 |
| 400 | 0.1 |
| 300 | 0.01 |

When the substrate first is exposed to atomic hydrogen in a CVD diamond reactor at 900° C., the entire molybdenum substrate becomes saturated in hydrogen because the diffusivity times the time exceeds the thickness of the thickness of the molybdenum substrate.

Deposition of CVD diamond on the molybdenum substrate forms a diamond-molybdenum substrate sandwich. If this sandwich is cooled rapidly, the hydrogen does not have time to diffuse out of the substrate and becomes frozen in solid solution. If the diamond-molybdenum substrate sandwich is cooled slowly, the hydrogen will precipitate. Because of the difficulty of nucleating hydrogen bubbles homogeneously in the bulk of the molybdenum, the hydrogen will first precipitate heterogeneously at an interface such as the molybdenum-diamond interface. Precipitation of hydrogen at the interface will weaken the bonding between the molybdenum substrate and the diamond sheet. Stresses built up by difference in thermal expansion between the diamond and the molybdenum substrate will cause rupturing of the weakened molybdenum-diamond interface.

Instead of using a straight line cooling regimen, the temperature of the molybdenum-diamond compact could be lowered quickly to between 500° C. to 600° C. and held there for 15 minutes to allow hydrogen precipitation at the interface and then cooled rapidly to room temperature to separate the free standing diamond sheet from the substrate.

Another means of preventing catastrophic separation of a CVD diamond sheet from a substrate, is by coating the substrate prior to deposition with a material which facilitates release of the diamond sheet from the substrate. It is preferred that the substrate be polished prior to coating.

A number of one month experiments were run using molybdenum plates covered with a thick boron nitride slurry, molybdenum plates covered with a thin boron nitride slurry, molybdenum plates with a dusting of either boron nitride powder, cerium oxide powder, graphite or iron oxide powder, molybdenum plates coated with thick and thin coating of ferric ferrocyanide (Prussian Blue), molybdenum plates coated with thick and thin coats of boron, molybdenum plates prereacted with carbon or boron and molybdenum plates coated with a dusting of molybdenum carbide powder. Thick coatings have a thickness of greater than one mil, and thin coatings have a thickness of less than one mil. Thin coatings are preferred.

It is unlikely that one unique combination or single treatment will be found to be the best one, since they all work to some degree as described above. It is also important that the release method that is finally selected does not have any deleterious effects on the CVD diamond product (such as ruining it surface finish).

By using a combination of surface smoothing and surface coating, a flat 1" by 12" monolithic slab of CVD diamond has been produced.

So far the following trends which are difficult to quantify have been established. First, the bond strength between the CVD diamond film and the substrate decreases as the smoothness of the substrate increases. Thus a polished substrate will release a CVD diamond film more readily than a sandblasted surface. Secondly, the bond strength between the CVD diamond film and the substrate decreases as the thickness of an additional coating on the substrate increases. Hence, a thick coating of boron nitrite will have a smaller bond strength than a thin coating. Finally, the bond strength between the CVD diamond film and the substrate decreases if the substrate has undergone a chemical reaction to form a stable compound on its surface before diamond deposition. Thus, a substrate that has been reacted with boron to form molybdenum boride or carbon to form molybdenum carbide will form a weaker bond with the CVD diamond than a fresh molybdenum substrate.

What is claimed is:

1. A method of making a monolithic sheet of diamond by the chemical vaporization deposition of diamond, by vaporization of carbon onto a substrate in an enclosed chamber, forming a bond during deposition of the diamond to the substrate of sufficient strength to retain the diamond sheet on the substrate wherein the improvement comprises cooling the diamond bonded to the substrate at a cooling rate which decreases the bond strength of the diamond sheet to the substrate sufficiently to allow removal of the diamond sheet intact from the substrate, then separating the diamond sheet from the substrate.

2. The method of claim 1 wherein the vaporization is hot filament vaporization.

3. The method of claim 1 wherein the substrate is cooled from a temperature 50° C. below the temperature at which diamond was deposited to 400° C. over a period of from 10 minutes to the time that the diamond spontaneously releases from the substrate or for four hours.

4. The method of claim 3 wherein the substrate is cooled for a period of from 15 minutes to two hours.

5. The method of claim 1 wherein the substrate is cooled by increasing chamber pressure while maintaining filament temperature.

6. A method of making a monolithic sheet of diamond by the chemical vaporization deposition of diamond, by vaporization of carbon onto a substrate in an enclosed chamber, forming a bond during deposition of the diamond to the substrate of sufficient strength to retain the diamond sheet on the substrate wherein the improvement comprises stopping the cooling of the diamond bonded to the substrate for a period of from five minutes to two hours at a temperature of from 400° C. to 800° C. to decrease the strength of bond between the diamond sheet and the substrate sufficiently to allow removal of the diamond sheet intact from the substrate, then separating the diamond sheet from the substrate.

7. The method of claim 6 wherein the vaporization is hot filament vaporization.

8. The method of claim 6 wherein the substrate temperature is lowered by 50° C. before cooling is stopped.

9. A method for making a monolithic diamond by chemical vapor deposition of a diamond coating on at least one substrate which comprises first applying to said substrate a layer of a material which decreases adhesion of the diamond coating to the substrate, said material being selected from the class consisting of molybdenum carbide powder, boron nitride slurry, boron nitride powder, cerium oxide powder, graphite powder, iron oxide powder, ferric ferrocyanide and boron; subsequently depositing said diamond coating on said adhesion decreasing layer, and then removing said diamond coating from said substrate.

10. The method of claim 9 wherein the substrate comprises molybdenum.

11. The method of claim 9 wherein said adhesion decreasing layer is selected from the class consisting of molybdenum carbide, boron nitride slurry, boron nitride powder, cerium oxide powder, graphite powder, iron oxide powder, ferric ferrocyanide, boron, and boron or carbon reacted with the surface of the substrate.

12. The method of claim 9 wherein the surface of the substrate is polished or smooth to further decrease the adhesion of the diamond coating to the substrate.

* * * * *